United States Patent [19]

Rumennik

[11] Patent Number: 5,072,268
[45] Date of Patent: Dec. 10, 1991

[54] MOS GATED BIPOLAR TRANSISTOR

[75] Inventor: Vladimir Rumennik, Los Altos, Calif.

[73] Assignee: Power Integrations, Inc., Mountain View, Calif.

[21] Appl. No.: 668,249

[22] Filed: Mar. 12, 1991

[51] Int. Cl.[5] ................... H01L 29/10; H01L 29/78
[52] U.S. Cl. ........................... 357/23.4; 357/23.8; 357/38; 357/46; 357/86
[58] Field of Search ............. 357/23.4, 23.8, 34, 357/38, 38 T, 43, 46, 86

[56] References Cited

U.S. PATENT DOCUMENTS

| | | | |
|---|---|---|---|
| 4,712,124 | 12/1987 | Stupp | 357/38 |
| 4,811,075 | 3/1989 | Eklund | 357/46 |
| 4,926,074 | 5/1990 | Singer et al. | 307/581 |
| 4,939,566 | 7/1990 | Singer et al. | 357/41 |
| 4,952,991 | 8/1990 | Kayama | 357/23.4 |
| 4,963,951 | 10/1990 | Adler et al. | 357/23.7 |
| 4,965,647 | 10/1990 | Takahashi | 357/23.8 |
| 4,967,246 | 10/1990 | Tanaka | 357/23.4 |
| 4,972,240 | 11/1990 | Murakani et al. | 357/23.4 |

OTHER PUBLICATIONS

Article entitled, "Comparison of High Voltage Devices for Power Integrated Circuits", by R. Jayaraman et al., IEDM, 1984.

Primary Examiner—Andrew J. James
Assistant Examiner—Sara W. Crane
Attorney, Agent, or Firm—Thomas E. Schatzel

[57] ABSTRACT

A high voltage transistor includes a substrate of a first conductivity type. Within the substrate is a well region of a second conductivity type. A source region is within the substrate and adjoins the substrate surface. The source region includes a pocket of semiconductor material of the first conductivity type and a pocket of semiconductor material of the second conductivity type. A drain region is placed within the well region and adjoins the substrate surface. The drain region includes a pocket of semiconductor material of the first conductivity type and a pocket of semiconductor material of the second conductivity type. A source contact is electrically connected to the source region. A drain contact is electrically connected to the drain region. A top region of the first conductivity type is within the well region separate from the drain region and extends laterally from the drain region toward the source region. An insulating layer is deposited on the substrate covering a chennel region between the top region and the source region and covering at least a portion of the source region and the top region. A gate electrode is placed on the insulating region electrically isolated from the substrate.

9 Claims, 1 Drawing Sheet

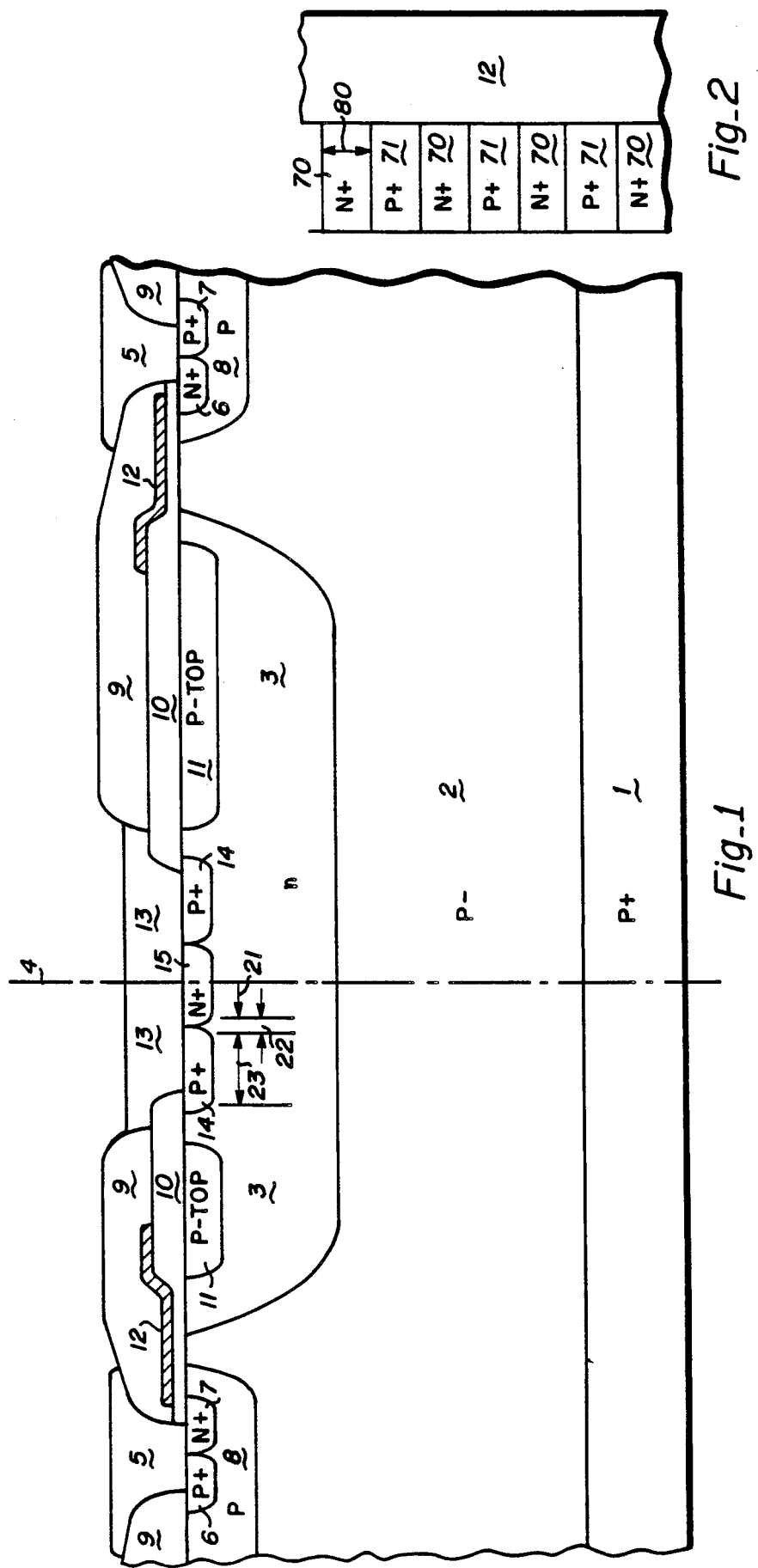

MOS GATED BIPOLAR TRANSISTOR

BACKGROUND

The present invention concerns a MOS gated bipolar transistor (MOSGBT).

In the construction of high voltage integrated circuits, it is desirable to design circuits which allow for a high current conduction and high voltage yet are simple and inexpensive to manufacture, rugged, and cause little power loss.

There have been many structures proposed for high voltage integrated circuits. See for example, R. Jayaraman, V. Rumennik, B. Singer, E.H. Stupp, *Comparison of High Voltage Devices For Power-Integrated Circuits,* IEDM, Electron Devices, 1984, pages 258-261. See also U.S. Pat. No. 4,967,246 issued to Akio Tanaka; U.S. Pat. No. 4,963,951 issued to Michael S. Adler et al; U.S. Pat. No. 4,811,075 issued to Klas H. Eklund; U.S. Pat. No. 4,926,074 issued to Barry M. Singer et al; and, U.S. Pat. No. 4,939,566 issued to Barry M. Singer et al.

SUMMARY OF THE INVENTION

In accordance with the preferred embodiment of the present invention, an improved high voltage transistor is presented. The high voltage transistor includes a substrate of a first conductivity type, for example of conductivity type p. The substrate has a surface. Within the substrate is a well region of a second conductivity type, for example of conductivity type n. The well region is typically doped with a dosage greater than $2 \times 10^{12}$ atoms per square centimeter A source region is within the substrate and adjoins the substrate surface The source region includes a pocket of semiconductor material of the first conductivity type and a pocket of semiconductor material of the second conductivity type.

A drain region is placed within the well region and adjoins the substrate surface. The drain region includes a pocket of semiconductor material of the first conductivity type and a pocket of semiconductor material of the second conductivity type. In the preferred embodiment, within the drain region, pockets of semiconductor material of the first conductivity type are alternated with pockets of semiconductor material of the second conductivity type.

A source contact is electrically connected to the source region. A drain contact is electrically connected to the drain region. A top region of the first conductivity type is within the well region separate from the drain region and extends laterally from the drain region toward the source region. The top region is connected to ground. An insulating layer is deposited on the substrate covering a channel region between the top region and the source region and covering at least a portion of the source region and the top region. A gate electrode is placed on the insulating region electrically isolated from the substrate. The gate electrode controls current flow in the channel by field-effect.

The high voltage transistor may additionally include a punch through region of the first conductivity type and surrounding the source region. Additionally, the substrate may be made of $p^-$ material on $p^+$ material In the described high voltage transistor during operation, current conduction is predominantly bipolar with current flowing between the drain contact and ground (substrate contact) by way of the pocket of semiconductor material of the first conductivity type in the drain, the well region, and the substrate Current also flows between the source contact and the drain contact by way of the pocket of semiconductor material of the first conductivity type in the drain, the well region, and the pocket of semiconductor material of the first conductivity type in the source.

BRIEF DESCRIPTION OF THE DRAWINGS

FIG. 1 is a cross-sectional view showing the structure of a MOS gated bipolar transistor in accordance with the preferred embodiment of the present invention.

FIG. 2 shows a top-sectional view of the MOS gated bipolar transistor shown in FIG. 1 in accordance with the preferred embodiment of the present invention.

DESCRIPTION OF THE PREFERRED EMBODIMENT

FIG. 1 shows a cross-sectional view of the structure of a MOS gated bipolar transistor (MOSGBT) in accordance with the preferred embodiment of the present invention. In FIG. 1, the structure of two transistors are shown in mirror image around a dividing line 4. The transistors are built upon a $p^-$-type substrate 2. $P^-$-type substrate 2 is placed on top of a $p^+$-type substrate 1. The depth and doping of the substrates depends upon a variety of factors, including drain to source voltage (VDS) of the transistors. For example, $p^+$-type substrate 1 may have a depth of 500 microns and be heavily doped with $10^{19}$ atoms per cubic centimeter $P^-$-type substrate 2 may, for example, have a depth of 35 to 40 microns and be doped with $10^{15}$ atoms per cubic centimeter for a VDS of 400 volts, and may have a depth of 75-80 microns and be doped with $10^{14}$ atoms per cubic centimeter for a VDS of 800 volts. $P^+$-type substrate 1 is connected to ground.

In $p^-$-type substrate 2 is placed an n-type well region 3 having, for example, a depth of five to seven microns. N-type well region 3 is doped with a dosage greater than $2 \times 10^{12}$ atoms per square centimeter, for example, $5 \times 10^{12}$ atoms per square centimeter. Within n-type well region 3 is a p-type top region 11 having, for example, a depth of one to two microns. P-type top region 11 is doped with, for example, a dose of 1 to $3 \times 10^{12}$ atoms per square centimeter. For example, p-type top region 11 is connected to ground in a plane not shown in FIG. 1. Further, the length of p-type top region 11 may vary due to a number of factors. For a VDS of 400 volts, the length of p-type top region 11 may be, for example, 20 microns. For a VDS of 800 volts, the length of p-type top region 11 may be, for example, 50 microns.

A source area includes a p-type region 8 having a depth of, for example, 1 to 2 microns. P-type region 8 is included to prevent punch through voltage breakdown. P-type region 8 is doped with, for example, $3 \times 10^{12}$ atoms per square centimeter. In p-type region is a $p^+$-type pocket 6 having a depth of, for example 0.5 microns, and an $n^+$-type pocket 7 having a depth of, for example 0.4 microns. $N^+$-type pocket 7 is doped at, for example, $10^{19}$ atoms per cubic centimeter with a dosage of, for example, $10^{15}$ to $10^{16}$ atoms per square centimeter. $P^+$-type pocket 6 is doped at, for example, $10^{19}$ atoms per cubic centimeter with a dosage of, for example, $10^{15}$ to $10^{16}$ atoms per square centimeter. A metal conductor 5 provides for connections to the source area.

A drain area includes a $p^+$-type pocket 14 having a depth of, for example 0.5 microns, and an $n^+$-type pocket 15 having a depth of, for example 0.4 microns. N+-type pocket 15 is doped at, for example, $10^{19}$ atoms per cubic centimeter with a dosage of, for example, $10^{15}$ to $10^{16}$ atoms per square centimeter. P+pocket 14 is doped at, for example, $10^{19}$ atoms per cubic centimeter with a dosage of, for example, $10^{15}$ to $10^{16}$ atoms per square centimeter. A metal conductor 13 provides for connections to the drain area.

A gate area includes a polysilicon layer 10 placed over a layer of thermal oxide 10. An oxide preservation layer 9 serves to provide insulation to the circuit.

One unique feature of the present invention is in the drain area where a complex structure includes the addition of p+pocket 14 to what is otherwise an insulated-gate, field-effect transistor. The introduction of P+pocket 14 provides for the injection of minority carriers during operation of the transistor. In FIG. 1, 25 injected holes form a P-N-P bipolar transistor between p+-type pocket 14 which functions as an emitter, n-type well region 3 which functions as a base, and both p+-type substrate 1 and p+-type pocket 6 each of which functions as a collector. During operation, the current conduction mechanism becomes predominantly bipolar, thus increasing the device current capability significantly, in some cases by as much as ten times.

Characteristics of the transistor vary with values of a dimension 21 which is one half the total length of n+-type pocket 15 (i.e., the portion of the length of n+-type pocket 15 which is apportioned to each transistor), a dimension 22 which is the distance between n+-type pocket 15 and p+-type pocket 14, and a dimension 23 which is the length of p+-type pocket 14. A typical value for dimension 21 is 10 microns, a typical value for dimension 22 is zero to ten microns and a typical value for dimension 23 is 10 to 15 microns.

As dimension 23 becomes shorter, the bipolar transistor injects less. When dimension 23 is zero, the transistor functions as a MOSFET. Further, dimension 21 and, to a lesser degree, dimension 23 dictate the value of the turn-on voltage of the transistor. In general, increasing dimension 23 and decreasing dimension 21 results in lowering the turn-on voltage, reducing the MOS current through n+-type pocket 15 and slowing the transistor switching time.

The value of dimension 22 is also important in the control of the turn-on voltage, the MOS current and the device switching speed. In general when dimension 22 exceeds tens of microns, then the presence of n+-type pocket 15 becomes irrelevant to the transistor performance.

One important characteristic of the high voltage transistor operating in the bipolar mode is the collector emitter breakdown voltage which can occur as a result of the voltage between the collector and emitter (VCE) when there is an open base. When transistors are fabricated in accordance with the present invention, the degradation of VCE is diminished via n+-type pocket 13 since pocket 14 becomes effectively shorted to (base) pocket 15, thus significantly suppressing the emitter efficiency.

Due to the high concentration level of doping in n-type well region 3, transistors made in accordance with the present invention are rugged. That is, the transistors will sustain a high level of energy and will be more stable than the cited prior art devices, without using a buffer layer that requires additional masking steps.

Further, it is possible to integrate devices manufactured in accordance with the present invention with low voltage control circuits. This may be done in a manner similar to that disclosed by U.S. Pat. No. 4,811,075 issued to Klas H. Eklund.

FIG. 2 shows a top view—with oxide and metal layers removed—of an alternate embodiment of the source area. In this embodiment n+-type pockets 70 are alternated with p+-type pockets 71. A width 80 of n+-type pockets 70 and p+-type pockets 71 is, for example, 3 microns. A source constructed according to this embodiment allows for high latch-up current. This alternate embodiment is especially useful for maintaining high device performance at high temperatures.

It will be understood by one of skill in that art that devices according to the present invention have many uses when integrated on an integrated circuit. For example, back-to-back construction of the devices may be used for AC switching etc. The present invention allows for the integration of MOSFET and MOSGBT devices in close proximity. The present invention allows for parallel construction of MOSFET and MOSGBT devices when MOSFET devices are used primarily to keep AC losses low and MOSGBT devices are used to keep on state losses low. This may be done by turning off the MOSGBT devices first, and then turning off the MOSFET devices thereby benefitting from the high speed of the MOSFET devices. Also the present invention may be used to construct a Darlington configuration with MOSGBTs or with MOSGBTs used in conjunction with MOSFETs.

Also, while FIG. 1 shows an n-channel MOSGBT, by reversing the polarity of the materials shown in FIG. 1, a p-channel MOSGBT is obtained. This may be especially beneficial as p-channel MOSFETs are usually two to three times larger than n-channel MOSFETs. The p-channel and n-channel MOSGBTs, however, are approximately of the same size.

Finally, by arranging the values of dimensions 21, 22 and 23 as discussed above, it is possible to obtain a desirable relationship between AC losses and DC losses of the device. It is possible, therefore, to tailor each design to a desirable specification. Such flexibility and general control of switching characteristics is either impossible or difficult in insulated gate bipolar transistor made in accordance with the prior art.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A high voltage transistor comprising:
   a substrate of a first conductivity type having a surface;
   a well region of a second conductivity type within the substrate;
   a source region within the substrate and adjoining the substrate surface, the source region including a pocket of semiconductor material of the first conductivity type and a pocket of semiconductor material of the second conductivity type;
   a drain region within the well region and adjoining the substrate surface, the drain region including a pocket of semiconductor material of the first conductivity type and a pocket of semiconductor material of the second conductivity type;

a source contact electrically connected to the source region;

a drain contact electrically connected to the drain region;

a top region of the first conductivity type within the well region separate from the drain region, connected to ground, and extending laterally from the drain region toward the source region;

an insulating layer deposited on the substrate covering a channel region between the top region and the source region and covering at least a portion of the source region and the top region; and, a gate electrode on the insulating region electrically isolated from the substrate, the gate electrode controlling by field-effect current flow in the channel.

2. A high voltage transistor as in claim 1 additionally comprising:

a punch through region of the first conductivity type, within the substrate, the punch through region surrounding the source region.

3. A high voltage transistor as in claim 1 wherein the first conductivity type is p and the second conductivity type is n.

4. A high voltage transistor as in claim 3 wherein the substrate includes p$^-$ material on p$^+$ material.

5. A high voltage transistor as in claim 1 wherein the well region is doped with a dosage greater than $2 \times 10^{12}$ atoms per square centimeter.

6. A high voltage transistor as in claim 1 wherein within the source region the pocket of semiconductor material of the first conductivity type is a first pocket in a plurality of pockets of semiconductor material of the first conductivity type and the pocket of semiconductor material of a second conductivity type is a first pocket in a plurality of pockets of semiconductor material of the second conductivity type, and wherein within the source region pockets from the plurality of pockets of semiconductor material of the first conductivity type are placed alternating with pockets from the plurality of pockets of semiconductor material of the second conductivity type.

7. A high voltage transistor as in claim 1 wherein in the drain region the pocket of semiconductor material of the first conductivity type is laterally separate from the pocket of semiconductor material of the second conductivity type.

8. A high voltage transistor as in claim 1 wherein during operation of the high voltage transistor, current conduction is predominantly bipolar with current flowing between the drain contact and ground by way of the pocket of semiconductor material of the first conductivity type in the drain, the well region, and the substrate.

9. A high voltage transistor as in claim 8 wherein during operation of the high voltage transistor current also flows between the source contact and the drain contact by way of the pocket of semiconductor material of the first conductivity type in the drain, the well region, and the pocket of semiconductor material of the first conductivity type in the source.

* * * * *